(12) United States Patent
Augustyniak et al.

(10) Patent No.: US 7,907,015 B2
(45) Date of Patent: Mar. 15, 2011

(54) CIRCUIT FOR COMPENSATION OF LEAKAGE CURRENT-INDUCED OFFSET IN A SINGLE-ENDED OP-AMP

(75) Inventors: Marcin Augustyniak, Regensburg (DE); Bernhard Wicht, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 5 days.

(21) Appl. No.: 12/249,370

(22) Filed: Oct. 10, 2008

(65) Prior Publication Data

US 2010/0148875 A1    Jun. 17, 2010

Related U.S. Application Data

(60) Provisional application No. 61/017,002, filed on Dec. 27, 2007.

(30) Foreign Application Priority Data

Oct. 10, 2007  (DE) .......................... 10 2007 048 454

(51) Int. Cl.
  *H03F 1/14* (2006.01)
(52) U.S. Cl. ....................................... 330/292
(58) Field of Classification Search .................. 330/253, 330/260, 292
  See application file for complete search history.

(56) References Cited

U.S. PATENT DOCUMENTS 4,500,846 A * 2/1985 Lewyn et al. ................. 330/253

OTHER PUBLICATIONS

Deutsches Patent-und Markenamt Office Action dated Apr. 29, 2008, regarding Application No. 10 2007 048 454.4-35.
"A 12-bit Medium-Time Analog Storage Device in a DMOS Standard Process," IEEE Journal of Solid-State Circuits, vol. 33, No. 7, Jul. 1998, pp. 1139-1143 (Martin Ehlert and Heinrich Klar).
"An Improved Frequency Compensation Technique for DMOS Operational Amplifiers," IEEE Journal of Solid-State Circuits, vol. SC-18, No. 6, Dec. 1983, pp. 629-633 (Bhupendra K. Ahuja).

* cited by examiner

*Primary Examiner* — Steven J Mottola
(74) *Attorney, Agent, or Firm* — William B. Kempler; Wade J. Brady, III; Frederick J. Telecky, Jr.

(57) ABSTRACT

An electronic device includes an operational amplifier, with the operational amplifier having an amplifier input stage coupled with a first output node to an amplifier output stage. A compensation capacitance is connected between an output node of the amplifier output stage and the first output node of the amplifier input stage, thereby operating as a compensator for stabilizing the operational amplifier. The compensation capacitance provides a parasitic diode drawing a first leakage current from the first output node of the amplifier input stage, a leakage current compensation circuit being coupled to the first output node of the amplifier input stage and coupled to a second output node of the amplifier input stage for drawing a first current from the first output node and a second current from the second output node. The leakage current compensation circuit is adapted such that the second current is greater than the first current by an amount corresponding to the first leakage current.

7 Claims, 1 Drawing Sheet

CIRCUIT FOR COMPENSATION OF LEAKAGE CURRENT-INDUCED OFFSET IN A SINGLE-ENDED OP-AMP

CROSS-REFERENCE TO RELATED APPLICATIONS

This application claims the benefit of application Ser. No. 61/017,002 filed Dec. 27, 2007 which is incorporated herein by reference in its entirety.

FIELD OF THE INVENTION

The present invention generally relates to an electronic device including a operational amplifier. More specifically the present invention relates to an offset compensation circuit for Miller compensated single-ended operational amplifiers.

One of the most common architectures for integrated operational amplifiers (op-amp) is a single-ended two stage operational amplifier. Single-ended two (or more) stage op-amps need Miller compensation for stabilizing the op-amps. A Miller capacitance is coupled across the second stage from the op-amp output to an output of the first stage. FIG. 1(a) shows a conventional Miller-compensated single-ended op-amp, with a simplified circuit diagram of this Miller compensation scheme being shown in FIG. 1(b). The first stage ST1 is a differential input stage having a transconductance gm. The second stage is coupled to a first output node of the differential input stage. In order to prevent the op-amp from oscillating or to achieve a specific settling behavior, a Miller capacitance $C_M$ is coupled between the output node Vout of the second stage ST2 and the output node V1 of the differential amplifier input stage ST1. An integrated circuit including such an op-amp can be processed (i.e. manufactured) in a specific technology or process. Some processes offer capacitances consisting of two layers of polysilicon (i.e. poly-poly capacitance). These capacitances have good linearity, i.e. the capacitance with respect to the voltage across the capacitance is substantially constant, and only little parasitic effects, as for example parasitic diodes from a polysilicon layer to substrate or the like. However, other technologies do not provide poly-poly capacitors. Therefore, other layers must be used for capacitors. A typical choice is an n-well-poly capacitance consisting of an n-well layer (or region), which is an n-doped area in a p-substrate. Above the n-well region, a poly layer is arranged so as to form the two layer n-well-poly capacitance. However, this kind of capacitance is highly non-linear. Further, the n-well area is buried in the p-substrate and provides undesired parasitic elements, in particular a backward biased parasitic diode from the n-doped region to the p-substrate. The parasitic diode has a leakage current which is proportional to the diode area which is proportional to the capacitance value. The leakage current is drawn from the output node of the differential input stage. In order to compensate for the leakage current one branch of the differential input stage has to provide more current than the other branch, which results in an offset of the differential input stage, i.e. the op-amp has an offset. For a differential input stage having a transconductance gm, the offset voltage amounts to Voff=Ileak/gm, wherein Ileak is the leakage current provided by the Miller capacitance. As the leakage current depends on the area of the Miller capacitance, Voff=$\alpha$C/gm=$\alpha$/GBW, wherein $\alpha$ is technology dependent factor and GBW the gain-bandwidth product of the op-amp. Therefore, single-ended op-amps with n-well-poly capacitances as Miller compensation have an offset, which depends on the gain-bandwidth product GBW, temperature and the technology. The offset voltage Voff can hardly be removed by adapting the design of the op-amp (i.e. by dimensioning the components of the op-amp) as the GBW is given by the specification and can not be changed. Calibrating the op-amp is also almost impossible as the offset voltage is exponentially dependent on temperature. These considerations apply equally to a wide range of different op-amp architectures, such as nested or multipath Miller compensation op-amps, or so called Ahuja-compensation as described by B. K. Ahuja in "An improved frequency compensation technique for CMOS operational amplifiers, IEEE Journal of Solid-State Circuits, Volume 18, Issue 6, December 1983, pp. 629-633".

SUMMARY OF THE INVENTION

It is a general object of the present invention to provide an offset compensation circuit and principle that overcomes the drawbacks of a leakage current induced by a component used for op-amp transfer function compensation.

This and other objects and features are provided, in accordance with an aspect of the present invention provides an electronic device including an operational amplifier, with the operational amplifier comprising a amplifier input stage coupled with a first output node to an amplifier output stage. Preferably, the amplifier input stage can be differential, but also other architectures for the input stage can be used. A compensation capacitance is provided, which is connected between an output node of the amplifier output stage and the first output node of the amplifier input stage, thereby operating as a compensator for stabilizing the operational amplifier. The compensation capacitance provides a parasitic diode drawing a first leakage current from the first output node of the amplifier input stage. A leakage current compensation circuit is coupled to the first output node of the amplifier input stage and coupled to a second output node of the amplifier input stage for drawing a first current from the first output node and a second current from the second output node. Further, the leakage current compensation circuit is adapted such that the second current is greater than the first current by an amount corresponding to the first leakage current. The operational amplifier has a input stage connected to the amplifier output stage by its first output node. A compensation capacitance, which can be a Miller capacitance, is then connected between the first output node of the input stage and the output node of the output stage of the amplifier. The compensation capacitance has the effect of stabilizing the operational amplifier by acting as a compensator, which prevents the operational amplifier from oscillating or can achieve a specific settling behavior. In fact, the compensation capacitance has a component that acts as a parasitic diode, which draws a first leakage current from the amplifier at its first output node. A circuit for compensating leakage current is then connected between the first input node of the amplifier input stage and a second output node of the differential amplifier input stage. This leakage current compensation circuit draws a first current from the first output node and also draws a second current from the second output node of the amplifier input stage. The difference between the second current and the first current is then made equal to the first leakage current, by adapting the leakage current compensation circuit accordingly. In this way, the first and second currents drawn by the leakage current compensation circuit compensates the first leakage current and the influences of both currents on the operational amplifier offset are cancelled out. A component of the offset of the operational amplifier is then cancelled, which is normally difficult to cancel.

The leakage current compensation circuit may comprise a diode element having a second leakage current which is a factor k smaller than the first leakage current and a first current mirror for amplifying the second leakage current by a factor k. The first current mirror amplifies the second leakage current from the diode element by k so that the second leakage current multiplied by a factor k by the first current mirror then compensates the first leakage current.

Advantageously, the diode element is formed by use of the same layers, which are used for the compensation capacitance and which include the parasitic diode. The diode element can also be implemented as a parasitic diode. The leakage current produced by the diode element is then subject to the same physical parameters, as for example temperature, as the parasitic diode of the compensation capacitance. Accordingly, the compensation of the leakage current becomes independent from parameters like temperature or internal voltage levels, and it becomes more resistant to parameter variations due to production spread.

The compensation capacitance can comprise two capacitors coupled in an anti-parallel arrangement for compensating a nonlinearity of a single capacitor. The two capacitors can be, for example, high density n-well-poly capacitors. Coupling the two capacitors in an antiparallel arrangement reduces the non-linearity of such n-well-poly capacitors, especially for a rail to rail output voltage. The parasitic diode of the compensation capacitance is then connected to the output of the transconductance gm and is provided between the well and the substrate In one aspect of the invention, the first current mirror having a factor k is coupled to the first output node of the amplifier input stage and the leakage current compensation circuit further comprises a second current mirror having a factor k coupled to the second output node of the amplifier input stage. The diode element is then coupled to the first current mirror so as to reduce the first current by an amount corresponding to the first leakage current. The first current mirror sinks current from the first output node of the amplifier input stage and the second current mirror sinks current from the other side (the second output node) of the input stage.

BRIEF DESCRIPTION OF THE DRAWINGS

Further advantages and characteristics ensue from the description below of a preferred embodiment, with reference to the accompanying drawings, in which.

DETAILED DESCRIPTION OF THE INVENTION

Figure 2:
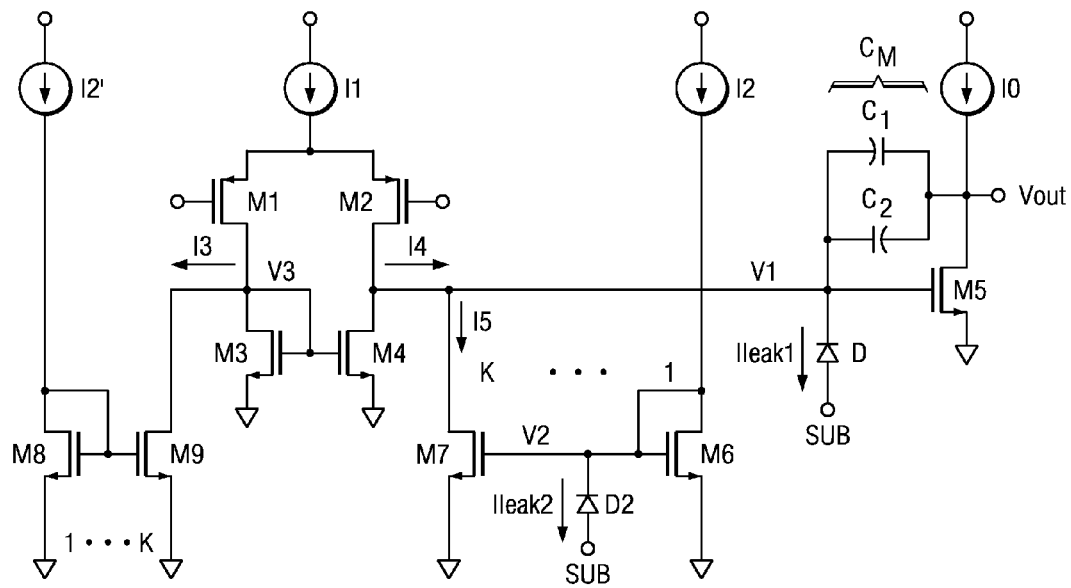
FIG. 2 is a simplified circuit diagram of an electronic device including a single-ended operational amplifier according to the invention.

FIG. 2 shows a single-ended operational amplifier according to one aspect of the invention. The differential amplifier has a differential input stage provided with a node N1, which receives a current I1 from an input current source, and is formed of a differential pair of PMOS transistors M1 and M2 having interconnected source terminals connected at the node N1. Gate terminals of the transistors M1 and M2 form the differential inputs of the amplifier. The drain terminal of the transistor M1 is connected to the drain terminal of a diode-connected NMOS transistor M3 and the drain terminal of the transistor M2 is connected to a further NMOS transistor M4.

An interconnection of the drain terminals of the transistors M2 and M4 forms a first output node V1 of the differential amplifier input stage and an interconnection of the drain terminals of the transistors M1 and M3 forms a second output node V3 of the differential amplifier input stage. The transistors M3 and M4 have interconnected gate terminals and source terminals both connected to ground. The first output node V1 of the differential input stage is connected to the gate terminal of an NMOS transistor M5, which provides the amplifier output stage, along with a current source I0. The drain terminal of the transistor M5 is connected to an amplifier output node Vout, as well as to the current source I0, with the source terminal of the transistor M5 being connected to ground. A compensation capacitance circuit $C_M$ is connected between the first output node V1 of the differential input stage of the amplifier and the output node Vout of the amplifier output stage. The compensation capacitance circuit $C_M$ is a so-called Miller capacitance and comprises an anti-parallel arrangement of capacitors C1 and C2, which compensate for the non-linearity of a single capacitance. In other words, the capacitors C1 and C2 are connected in parallel in an anti-parallel configuration between the output node V1 of the differential input stage and the amplifier output node Vout. In this example, the capacitors C1 and C2 are n-well poly capacitors. For such an anti-parallel arrangement of n-well polycapacitors a parasitic diode is always provided between the well and the substrate, represented here by the diode D connected between the differential stage output node V1 and the substrate connection SUB. This leads to a leakage current from the compensation capacitance circuit $C_M$, as explained with reference to FIG. 1.

A current leakage compensation circuit is provided for compensating for leakage current Ileak1 that occurs from the compensation capacitance circuit $C_M$. The first part of the current leakage compensation circuit is coupled to the first output node V1 of the amplifier's differential input stage and is formed of a current mirror arrangement of two NMOS transistors M6 and M7, as well as a diode D2 connected to a node V2 interconnecting the gate terminals of the transistors M6 and M7 and also to the substrate connection SUB. The drain terminal of the transistor M7 is connected to the first output node V1 of the input stage, with the transistor M6 being diode-connected and having its drain terminal connected to a current source I2. Source terminals of the transistors M6 and M7 are both connected to ground. A second part of the current leakage compensation circuit is connected to the second output node V3 of the differential input stage of the amplifier and is also formed of a current mirror arrangement of two NMOS transistors M8 and M9. The drain terminal of the transistor M9 is connected to the second output V3 of the input stage and the transistor M8 is diode-connected with its drain terminal being connected to a current source I2'. Source terminals of the transistors M8 and M9 are connected to ground. Current mirror transistors M6, M7, M8 and M9 are configured such that the transistors M7 and M9 have an area a factor k times the transistors M6 and M8.

Figure 1A:
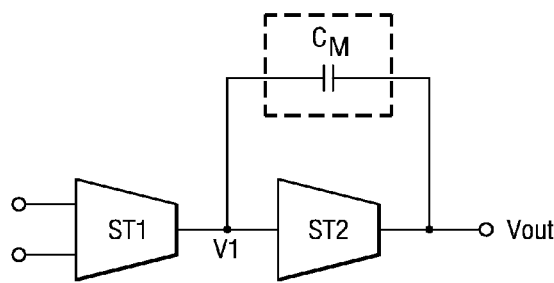
FIG. 1(a) is a simplified circuit diagram of a conventional Miller-compensated single-ended operational amplifier.
Figure 1B:
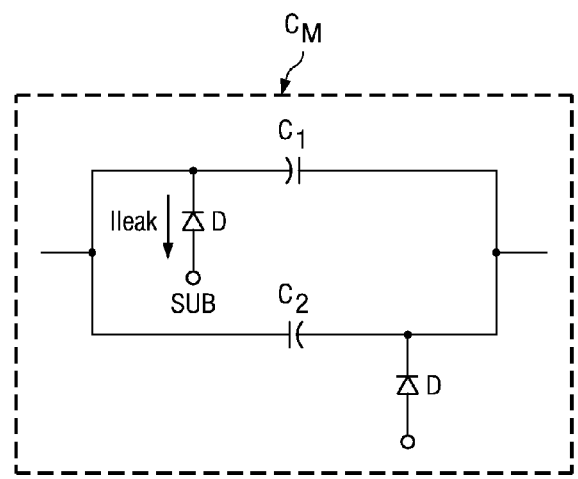
FIG. 1(b) is a simplified circuit diagram of a conventional Miller compensation scheme.

In operation of the operational amplifier, the leakage current Ileak from the compensation capacitance circuit $C_M$, including the anti-parallel arrangement of the capacitors C1 and C2, flows through the diode D, as explained with reference to FIG. 1. The current mirror formed by the transistors M6 and M7 sinks an amount of current k*I2 from the first output node V1 of the differential input stage, under the condition that K*I2<I1/2. By symmetry, this means that the current mirror formed by the transistors M8 and M9 also sinks an amount of current k*I2 from the second output node V3 on the other side of the input stage. At the same time, the diode D2 sinks a leakage current Ileak2 from the node V2. This means that the total current of the transistor M7 (the total current drawn from the first output node V1 of the input stage) is $$k*(I2-Ileak2)=I5 \qquad (1)$$

under the condition that Ileak2<I2. If the parasitic diode D is k times the size of the diode D2, then $$V2=V1 \qquad (2)$$

and $$a \cdot k * Ileak2 = Ileak \qquad (3).$$

In other words, the leakage current Ileak2 from the diode D2 is k times less than the leakage current Ileak from the parasitic diode D and is amplified by the current mirror M6, M7 by a factor of k. V2 can be made equal to V1 if the transistors M5 and M6 as well as the current sources 10 and 12 are matched. As a result, the currents loading the input stage are $$I3=k*I2 \qquad (4)$$

and $$I4=I5+Ileak=k*I2=I3 \qquad (5),$$

where I4 is the current at the first output V1 of the input stage and I3 is the current at the second output V3 of the input stage. So I3 is greater than I5 by an amount equal to the leakage current Ileak from the parasitic diode D. Since both currents I3 and I4 are symmetrical, the leakage current induced offset Ileak from the compensation capacitance circuit $C_M$ is cancelled.

In an alternative embodiment, instead of connecting the diode D2 to the node V2, it is also possible to achieve compensation of the leakage current Ileak by connecting the diode to the second output node V3 of the input stage. However, this configuration increases the capacitance at the node V3, which may decrease the stability of the operational amplifier (whereas a capacitance at the node V2 in the current mirror arrangement of transistors M6 and M7 does not affect the main feedback loop). Furthermore, using a current mirror with an amplification factor k>1 means that the area of the diode D2 is k times smaller than the parasitic diode D when the diode D2 is connected to the node V2. However, if the diode D2 is connected to V3, it must have the same area as the parasitic diode D.

In an integrated circuit, the physical layers used for the diode D and the diode D2 can be the same. This allows the physical properties of the diodes to be matched to a large extent. The temperature behavior or the voltage dependence of the diodes may then qualitatively similar. The compensation mechanism is the substantially independent from other parameters and will provide good performance over a large parameter range.

The present invention is also applicable and advantageous for operational amplifiers using the Ahuja compensation cited in hereinabove. With an Ahuja compensation instead of a Miller compensation, it is possible to use a single capacitor. The aspects of the present invention set out hereinabove can equally be applied to this single capacitor.

Although the invention has been described hereinabove with reference to a specific embodiment, it is not limited to this embodiment and no doubt further alternatives will occur to the skilled person that lie within the scope of the invention as claimed. For example, although a specific operational amplifier circuit has been described above, the invention can also be implemented in other types of operational amplifier technology, e.g. folded-cascode, telescopic cascode, N/P input differential pair, and N/P output transistor, to name but a few.

Although the present invention has been described with reference to a specific embodiment, it is not limited to this embodiment and no doubt alternatives will occur to the skilled person that lie within the scope of the invention as claimed.

The invention claimed is:

1. An electronic device including an operational amplifier, the operational amplifier comprising:
   an amplifier input stage coupled with a first output node (V1) to an amplifier output stage;
   a compensation capacitance (CM) connected between an output node (Vout) of the amplifier output stage and the first output node (V1) of the amplifier input stage thereby operating as a compensator for stabilizing the operational amplifier, the compensation capacitance (CM) providing a parasitic diode (D) drawing a first leakage current (Ileak1) from the first output node (V1) of the amplifier input stage;
   a leakage current compensation circuit (M6, M7, M8, M9, I2, I2') being coupled to the first output node (V1) of the amplifier input stage and coupled to a second output node (V3) of the amplifier input stage for drawing a first current (I5) from the first output node (V1) and a second current (I3) from the second output node (V3), wherein the leakage current compensation circuit is adapted such that the second current (I3) is greater than the first current (I5) by an amount corresponding to the first leakage current (Ileak1).

2. An electronic device including an operational amplifier, the operational amplifier comprising:
   an amplifier input stage coupled with a first output node (V1) to an amplifier output stage;
   a compensation capacitance (CM) connected between an output node (Vout) of the amplifier output stage and the first output node (V1) of the amplifier input stage thereby operating as a compensator for stabilizing the operational amplifier, the compensation capacitance (CM) providing a parasitic diode (D) drawing a first leakage current (Ileak1) from the first output node (V1) of the amplifier input stage;
   a leakage current compensation circuit (M6, M7, M8, M9, I2, I2') being coupled to the first output node (V1) of the amplifier input stage and coupled to a second output node (V3) of the amplifier input stage for drawing a first current (I5) from the first output node (V1) and a second current (I3) from the second output node (V3), wherein the leakage current compensation circuit is adapted such that the second current (I3) is greater than the first current (I5) by an amount corresponding to the first leakage current (Ileak1),
   wherein the leakage current compensation circuit comprises a diode element (D2) having a second leakage current (Ileak2) which is a factor k smaller than the first leakage current (Ileak1) and a first current mirror (M6, M7) for amplifying the second leakage (Ileak2) current by a factor k.

3. The electronic device according to claim 1, wherein the compensation capacitance (CM) comprises two capacitors (C1, C2) coupled in an anti-parallel arrangement for compensating a nonlinearity of a single capacitor (C1, C2).

4. The electronic device according to claim 2, wherein the compensation capacitance (CM) comprises two capacitors (C1, C2) coupled in an anti-parallel arrangement for compensating a nonlinearity of a single capacitor (C1, C2).

5. The electronic device according to claim 2, wherein the first current mirror (M6, M7) having a factor k is coupled to the first output node (V1) of the amplifier input stage and the leakage current compensation circuit further comprises a second current mirror (M8, M9) having a factor k coupled to the second output node (V3) of the amplifier input stage, and wherein the diode element (D2) is coupled to the first current mirror (M6, M7) so as to reduce the first current (I5) by an amount corresponding to the first leakage current (Ileak1).

6. An electronic device including an operational amplifier, the operational amplifier comprising:
   an amplifier input stage coupled with a first output node (V1) to an amplifier output stage;
   a compensation capacitance (CM) connected between an output node (Vout) of the amplifier output stage and the first output node (V1) of the amplifier input stage thereby operating as a compensator for stabilizing the operational amplifier, the compensation capacitance (CM) providing a parasitic diode (D) drawing a first leakage current (Ileak1) from the first output node (V1) of the amplifier input stage;
   a leakage current compensation circuit (M6, M7, M8, M9, I2, I2') being coupled to the first output node (V1) of the amplifier input stage and coupled to a second output node (V3) of the amplifier input stage for drawing a first current (I5) from the first output node (V1) and a second current (I3) from the second output node (V3), wherein the leakage current compensation circuit is adapted such that the second current (I3) is greater than the first current (I5) by an amount corresponding to the first leakage current (Ileak1), wherein the compensation capacitance (CM) comprises two capacitors (C1, C2) coupled in an anti-parallel arrangement for compensating a nonlinearity of a single capacitor (C1, C2), and
   wherein a first current mirror (M6, M7) having a factor k is coupled to the first output node (V1) of the amplifier input stage and the leakage current compensation circuit further comprises a second current mirror (M8, M9) having a factor k coupled to the second output node (V3) of the amplifier input stage, and wherein the diode element (D2) is coupled to the first current mirror (M6, M7) so as to reduce the first current (I5) by an amount corresponding to the first leakage current (Ileak1).

7. The electronic device according to claim 4, wherein the first current mirror (M6, M7) having a factor k is coupled to the first output node (V1) of the amplifier input stage and the leakage current compensation circuit further comprises a second current mirror (M8, M9) having a factor k coupled to the second output node (V3) of the amplifier input stage, and wherein the diode element (D2) is coupled to the first current mirror (M6, M7) so as to reduce the first current (I5) by an amount corresponding to the first leakage current (Ileak1).

* * * * *